(12) United States Patent
Ogata

(10) Patent No.: US 8,539,327 B2
(45) Date of Patent: Sep. 17, 2013

(54) SEMICONDUCTOR INTEGRATED CIRCUIT FOR TESTING LOGIC CIRCUIT

(75) Inventor: Yuuki Ogata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 240 days.

(21) Appl. No.: 13/153,681

(22) Filed: Jun. 6, 2011

(65) Prior Publication Data
US 2011/0307753 A1 Dec. 15, 2011

(30) Foreign Application Priority Data
Jun. 9, 2010 (JP) .................................. 2010-132342

(51) Int. Cl.
*G06F 11/00* (2006.01)
*H03M 13/00* (2006.01)

(52) U.S. Cl.
USPC .......................................... 714/815; 714/700

(58) Field of Classification Search
USPC .......................................... 714/700, 815, 733
See application file for complete search history.

(56) References Cited

U.S. PATENT DOCUMENTS

| | | | | |
|---|---|---|---|---|
| 4,542,505 A | * | 9/1985 | Binoeder et al. | 714/700 |
| 5,436,908 A | * | 7/1995 | Fluker et al. | 714/700 |
| 6,079,035 A | * | 6/2000 | Suzuki et al. | 714/700 |
| 6,594,797 B1 | * | 7/2003 | Dudley et al. | 714/815 |
| 6,665,499 B2 | * | 12/2003 | Watanabe | 398/154 |
| 7,139,952 B2 | * | 11/2006 | Matsumoto et al. | 714/726 |
| 7,480,838 B1 | * | 1/2009 | Wilkerson et al. | 714/700 |
| 7,543,206 B2 | | 6/2009 | Nobekawa | |
| 7,659,749 B2 | * | 2/2010 | Agarwal | 326/93 |
| 7,778,790 B2 | | 8/2010 | Furuya | |
| 2006/0068054 A1 | * | 3/2006 | Gearhardt et al. | 425/371 |
| 2009/0295613 A1 | * | 12/2009 | Hassibi et al. | 341/155 |

FOREIGN PATENT DOCUMENTS

| | | |
|---|---|---|
| JP | 2007-139603 A | 6/2007 |
| JP | 2007-263790 A | 10/2007 |

OTHER PUBLICATIONS

Raahemifar, K.; Ahmadi, M.; , "A design-for-testability technique for detecting delay faults in logic circuits," VLSI, 1998. Proceedings of the 8th Great Lakes Symposium on , vol., no., pp. 249-255, Feb. 19-21, 1998.*

* cited by examiner

*Primary Examiner* — Steve Nguyen
(74) *Attorney, Agent, or Firm* — Fujitsu Patent Center

(57) ABSTRACT

A semiconductor circuit for testing a logic circuit, the semiconductor circuit including: an exclusive OR circuit receiving an input testing signal to a circuit under testing and a output testing signal from the circuit under testing; a multiplexer receiving a result signal output from the exclusive OR circuit and a clock signal; and a flip-flop storing a logical value represented by a captured signal in synchronization with a multiplexed signal output from the multiplexer, the captured signal being selected from a entered signal (I) and a data signal that is output from another semiconductor circuit for testing.

8 Claims, 5 Drawing Sheets

US 8,539,327 B2

SEMICONDUCTOR INTEGRATED CIRCUIT FOR TESTING LOGIC CIRCUIT

CROSS REFERENCE TO RELATED APPLICATION

This application is based upon and claims the benefit of priority from the prior Japanese Patent Application NO. 2010-132342 filed on Jun. 9, 2010, the entire contents of which are incorporated herein by reference.

FIELD

The embodiments discussed herein are related to a semiconductor integrated circuit.

BACKGROUND

Miniaturization of integrated circuits is increasing the probability of frequent resistive open defects, which cause delay faults (malfunctions of circuits caused by signal delay), in circuits. Since a resistive open defect, unlike a full open defect, does not prevent a signal from flowing through the circuit, the impact of a resistive open defect on the behavior of the circuit that is seemingly properly operating at the factory may become noticeable in use after the shipment of the circuit. Therefore resistive open defects need to be adequately eliminated prior to shipment of circuits.

Logic testing using an automatic test pattern generation tool such as an automatic test pattern generator (ATPG) is being commonly used for testing integrated circuits. Techniques relating to circuit testing are disclosed in Japanese Laid-Open Patent Publication Nos. 2007-139603 and 2007-263790, for example.

However, while the logic testing using ATPG is effective for detection of stuck-at faults in which a logical value input into or output from a particular element is stuck at 0 or 1, the logic testing is not useful for detecting delay faults. This is because the ATPG generates test patterns from function-level circuit information and therefore does not assume delay faults at all.

SUMMARY

According to one aspect of the embodiments, there is provided a semiconductor circuit for testing a logic circuit, the semiconductor circuit including: an exclusive OR circuit receiving an input testing signal to a circuit under testing and a output testing signal from the circuit under testing; a multiplexer receiving a result signal output from the exclusive OR circuit and a clock signal; and a flip-flop storing a logical value represented by a captured signal in synchronization with a multiplexed signal output from the multiplexer, the captured signal being selected from a entered signal (I) and a data signal that is output from another semiconductor circuit for testing.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 1:
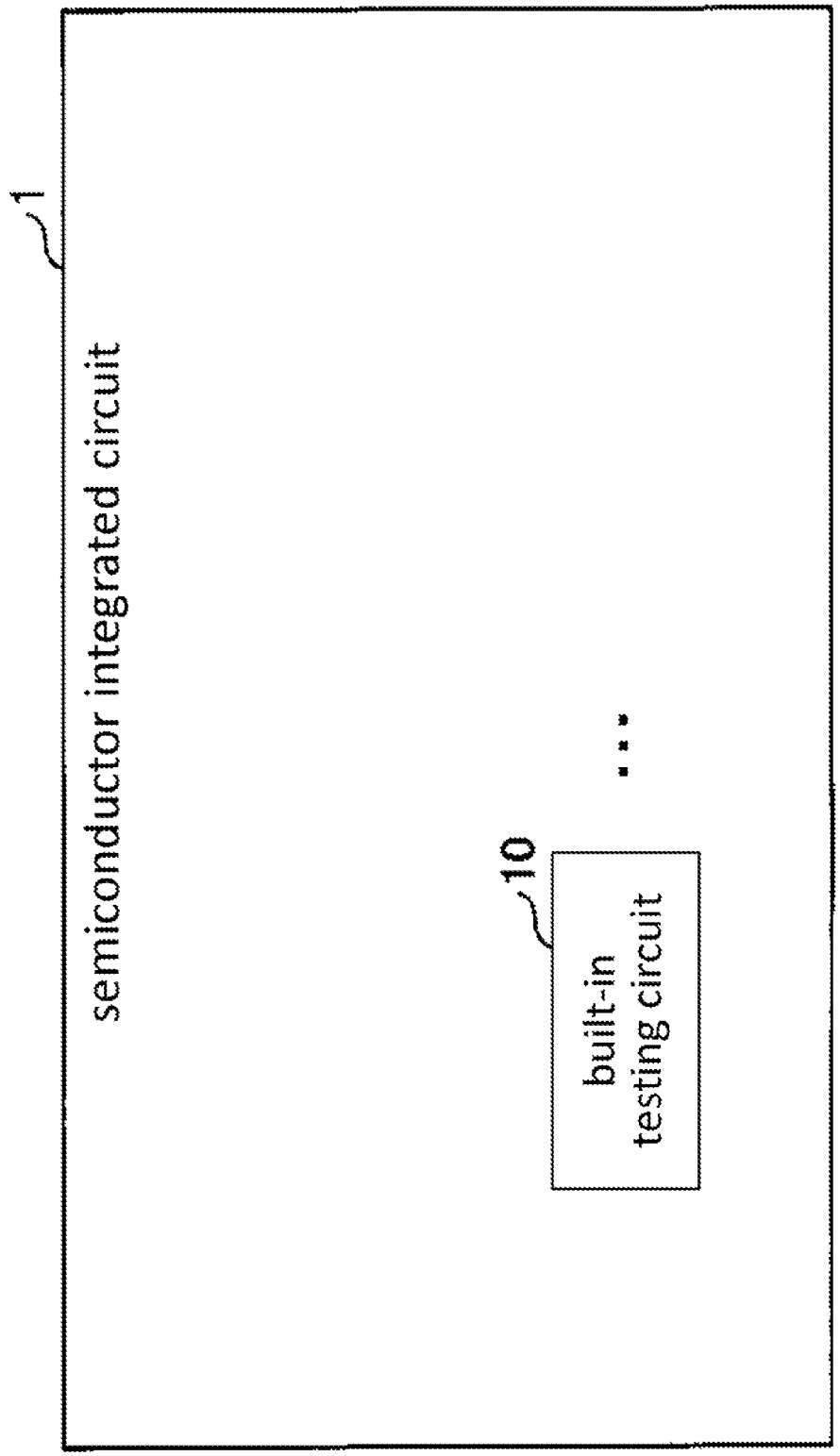
FIG. 1 is a diagram schematically illustrating an exemplary configuration of a semiconductor integrated circuit according to an embodiment of the present invention.

Embodiments of the present invention will be described with reference to drawings. FIG. 1 schematically illustrates an exemplary configuration of a semiconductor integrated circuit according to an embodiment of the present invention. The semiconductor integrated circuit 1 in FIG. 1 has (includes) one or more built-in testing circuits 10. The testing circuit(s) 10 is (are) redundant circuit(s) that does (do) not affect or contribute to the functionality of the semiconductor integrated circuit 1. That is, the testing circuit(s) 10 is (are) circuit(s) for detecting primarily delay faults caused by resistive open defects in parts (parts to be tested, or parts under test) of the semiconductor integrated circuit 1 other than the testing circuit(s) 10.

Figure 2:
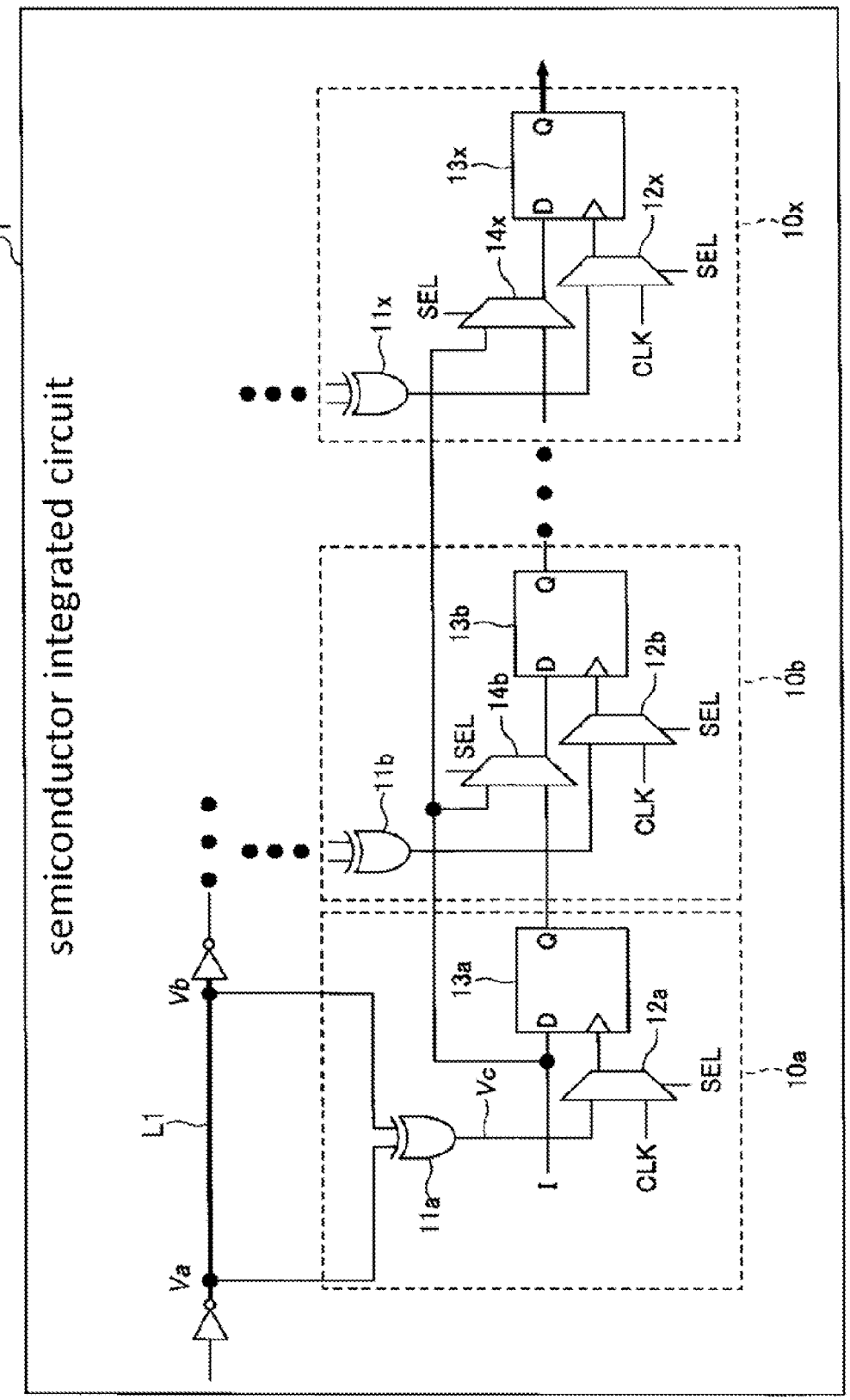
FIG. 2 is a diagram illustrating an exemplary configuration of a testing circuit according to an embodiment of the present invention.

FIG. 2 illustrates an exemplary configuration of testing circuits according to an embodiment of the present invention. Illustrated in FIG. 2 are a multiple testing circuits 10a, 10b, . . . , 10x. The testing circuits 10 are associated with different parts to be tested. For example, the testing circuit 10a is associated with a wiring line L1 that is to be tested by the testing circuit 10a. The other testing circuits 10 are associated with other wiring lines to be tested, not shown. A part in which a resistive open defect may occur is chosen as a part to be tested.

Each testing circuit 10 includes an exclusive OR (XOR) circuit 11, a multiplexer (MUX) 12, a flip-flop (FF) 13, and other components. When the components are to be distinguished among the testing circuits 10 herein, letters (a, b, . . . , x) appended to the reference numerals of the testing circuits 10 will be added to the reference numerals of the components.

The exclusive OR circuit 11 receives a signal at the input of a part under test (input signal Va) and a signal at the output of the part under test (output signal Vb) and outputs a signal Vc representing the exclusive OR of values represented by the two signals. The multiplexer 12 receives the signal Vc output from the exclusive OR circuit 11 and a clock signal CLK and selectively outputs one of the input signals according to a control input SEL. The flip-flop 13 is a D flip-flop including a data input terminal D, a clock terminal C and a data output terminal Q. A signal output from the multiplexer 12 is input to the clock terminal C. Accordingly, the flip-flop 13 takes in a value represented by a data input signal I at the data input terminal D, stores the value, and outputs a signal representing a value that has been stored in the flip-flop 13 from the data output terminal Q in synchronization with a rising edge of the signal output from the multiplexer 12.

The multiple flip-flops 13 of the multiple testing circuits 10 in FIG. 2 form a shift register. That is, the flip-flops 13 are cascaded so that data stored in each flip-flop 13 is shifted. In the shift register, a multiplexer 14 is provided between the data output terminal Q of the preceding flip-flop 13 (on the input side) and the input terminal D of the next flip-flop 13 (on the output side). For example, a multiplexer 14b is provided between a flip-flop 13a and a flip-flop 13b. Each multiplexer 14 receives a signal output from the preceding flip-flop 13 and a data input signal I and selectively outputs one of the input signals according to a control input SEL. The signal output from the multiplexer 14 is input to the input terminal Q of the next flip-flop 13.

While multiple testing circuits 10 are illustrated in FIG. 2, only a single testing circuit 10 may be included in the semiconductor integrated circuit 1 if the semiconductor integrated circuit 1 has only one part to be tested.

A procedure for detecting a resistive open defect in the semiconductor integrated circuit 1 using the testing circuit 10 will be described below. The detection procedure includes an initialization procedure, a test pattern input procedure and a detection result output procedure.

Figure 3:
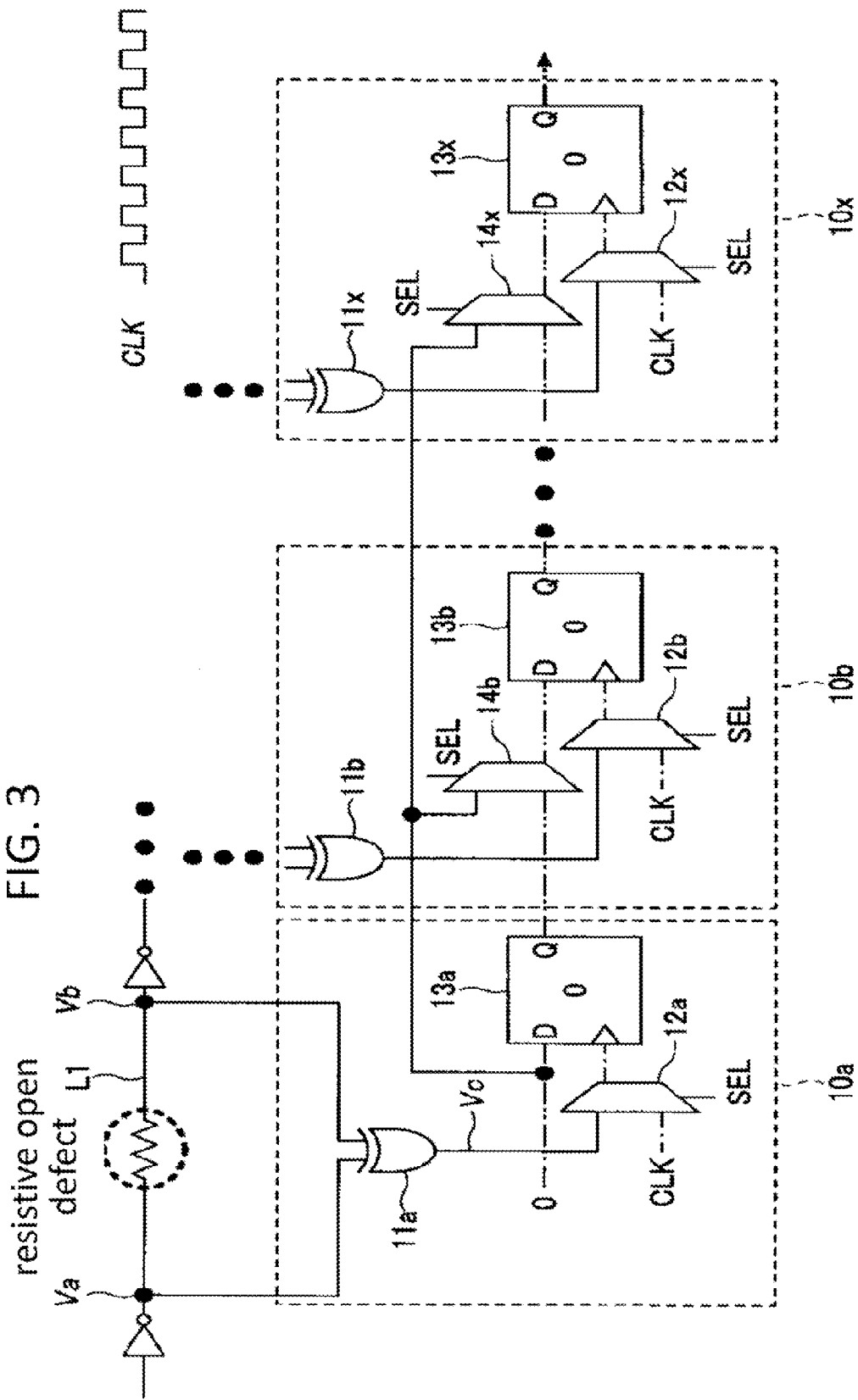
FIG. 3 is a diagram illustrating an initialization procedure.

FIG. 3 illustrates the initialization procedure. In the initialization procedure, the value of the data input signal I is set to "0". And the value of the control signal "SEL" is set to "1", Mux 12 output input clock signal "CLK". Accordingly, the data input signal I representing 0 is applied (input) to the first flip-flop 13a. A control input SEL for causing each multiplexer 12 to output a clock signal CLK illustrated at the top right of FIG. 3 is input into the multiplexer 12. Further, a control input SEL for causing each multiplexer 14 to output a signal output from the preceding flip-flop 13 is input into the multiplexer 14.

As a result, the value ("0") of the data input signal I is shifted from one flip-flop 13 to the next on a rising edge of the clock signal CLK and is output from the data output terminal Q of the last flip-flop 13x (at the last stage). Consequently, a 0 is stored in each flip-flop 13. The pattern of the signal output from the data output terminal Q of the flip-flop 13x may be observed to determine whether there is any abnormality in each testing circuit 10. That is, if consecutive 0s are detected, it may be determined that there is no abnormality in the testing circuits 10.

In the initialization procedure, the data input signal I is always set to "0" or always set to "1". In either case, it may be determined whether or not there is an abnormality in the testing circuits 10 on the basis of whether or not a pattern output from the output terminal Q of the flip-flop 10x is the same as the input pattern of the data input signal I. However, the same values, 0s or 1s, are stored in all of the flip-flops 13 at the end of the initialization procedure. In the present embodiment, 0s are stored in the flip-flops 13 at the end of the initialization procedure.

Figure 4:
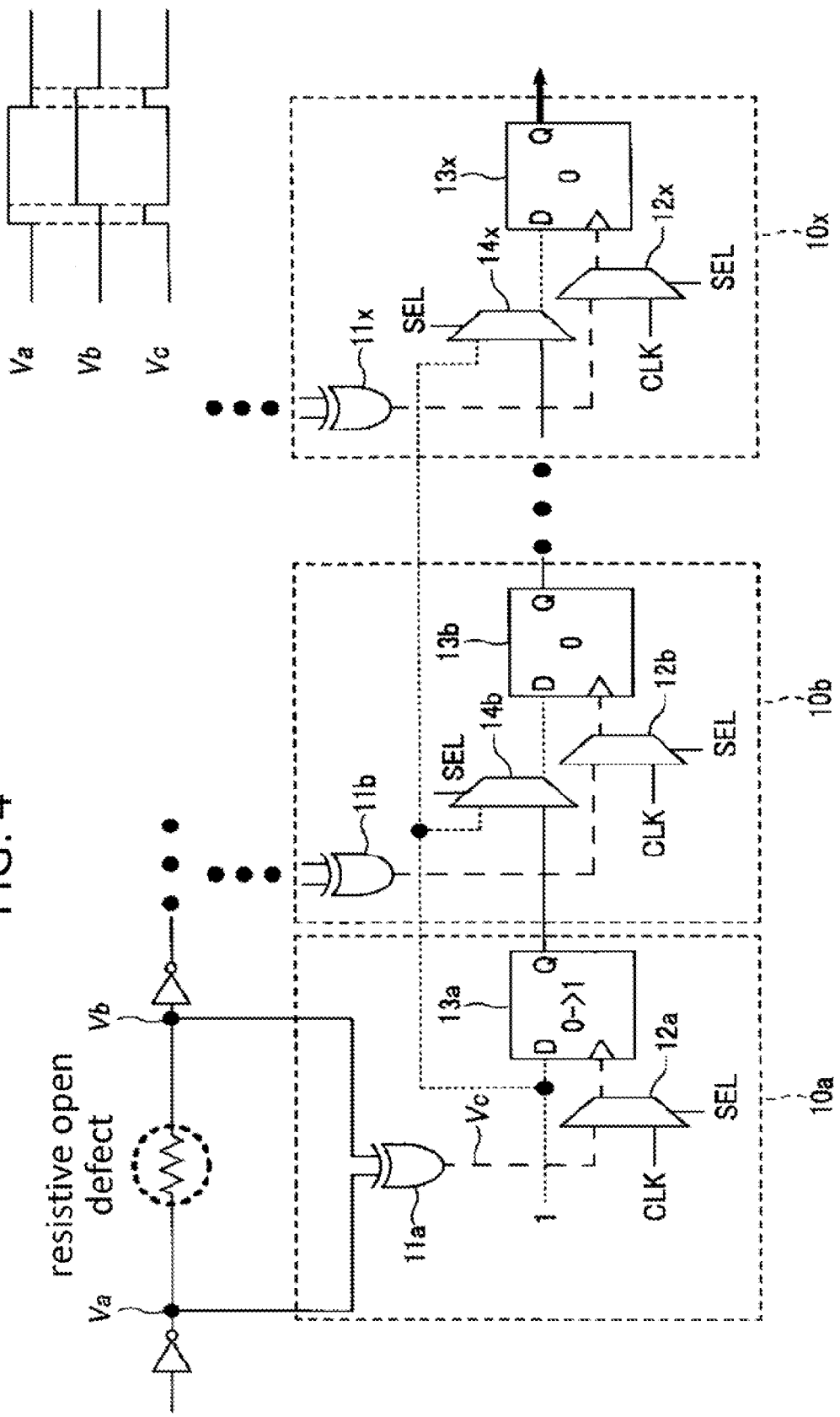
FIG. 4 is a diagram illustrating a test pattern input procedure.

FIG. 4 illustrates the test pattern input procedure. In the test pattern input procedure, a test pattern is applied to the semiconductor integrated circuit 1. The test pattern is a signal for testing (test signal). For example, a test pattern generated by an automatic test pattern generator (ATPG) may be used. However, the test pattern is not limited to a predetermined one; any signal pattern with varying signal values may be used.

A data input signal I representing "1" is applied to the testing circuits 10. The value ("1") of the data input signal I is constant throughout the test pattern input procedure. A control signal SEL, is set to "0", for causing each multiplexer 12 to output a signal output from the exclusive OR circuit 11 is input in the multiplexer 12. Furthermore, a control input SEL for causing each multiplexer 14 to output the data input signal I is input in the multiplexer 14.

If a resistive open defect has occurred in the wiring line L1, displacements occurs between the input single Va and the output signal Vb as illustrated at top right of FIG. 4. The exclusive OR circuit 11a outputs an output signal Vc representing "1" during the periods of the displacements.

As a result, the flip-flop 13a stores a 1, which is the value of the data input signal I, on a rising edge of the output signal Vc. If a resistive open defect has occurred in another part under test, the same operation is performed in the testing circuit 10 associated with the part under test.

Upon completion of the application of the test pattern, the test pattern input procedure ends. The flip-flop 13 of the testing circuit 10 associated with a part under test where a resistive open defect has been detected contains a "1" at the end of the test pattern input procedure.

Figure 5:
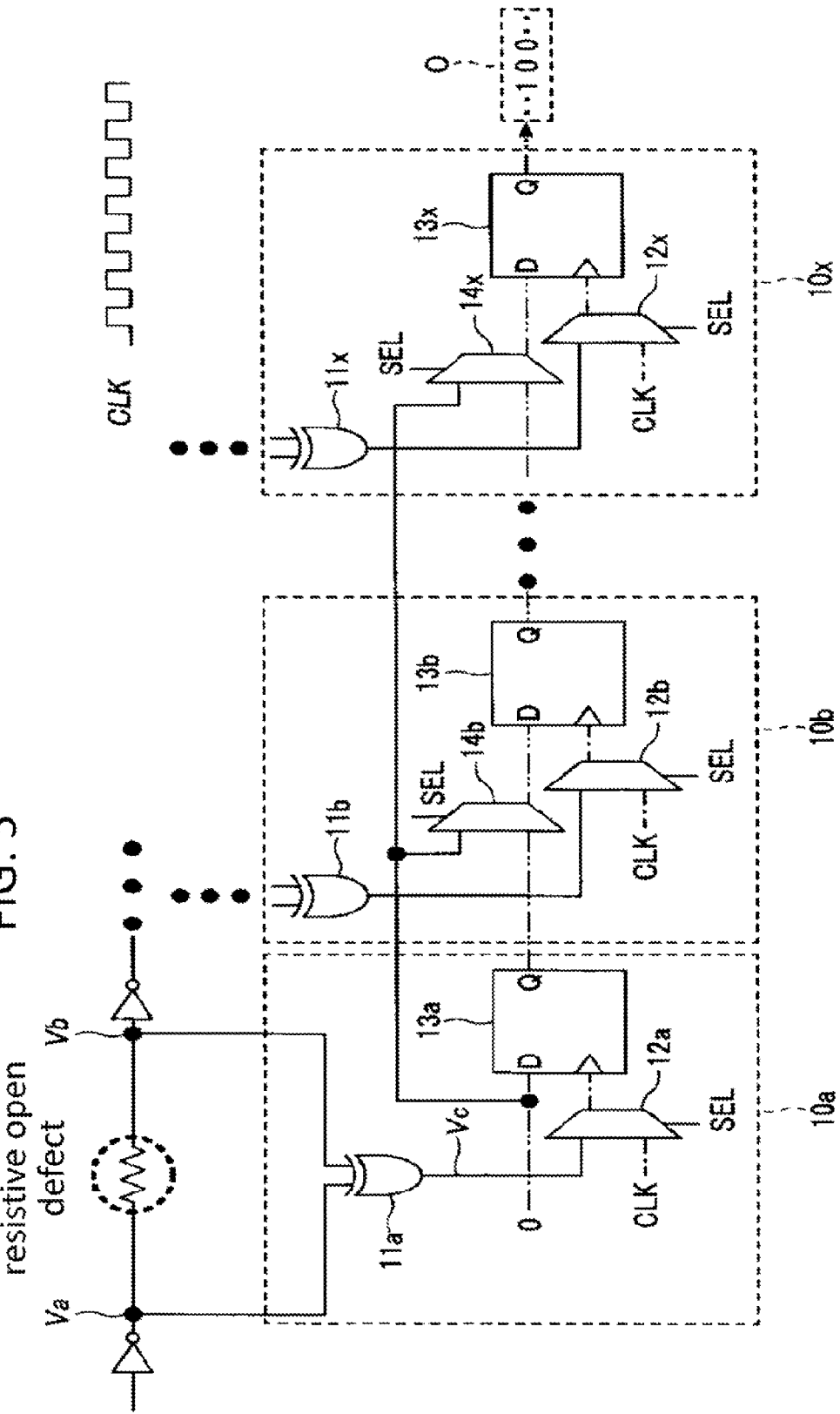
FIG. 5 is a diagram illustrating a detection result output procedure.

FIG. 5 illustrates the detection result output procedure. In the detection result output procedure, the value of the data input signal I is set to "0". And the value of the control signal "SEL" is set to "1", Mux 12 output input clock signal "CLK" same as the initialization procedure. Accordingly, the data input signal representing "0" is applied (input) to the first flip-flop 13a (at the first stage). A control input SEL for causing each multiplexer 12 to output a clock signal CLK illustrated at top right of FIG. 5 is input into the multiplexer 12. Furthermore, a control input SEL for causing each multiplexer 14 to output a signal output from the preceding flip-flop 13 is input in the multiplexer 14.

As a result, the values in the flip-flops 13s are shifted from one flip-flop 13 to the next on a rising edge of the clock signal CLK and are output from the data output terminal Q of the last flip-flop 13x (at the last stage) in sequence. A signal O output from the data output terminal Q may be observed to detect whether or not there is a resistive open defect and if there is a resistive open defect, the resistive open defect may be located. Specifically, if an output signal O that represents "1" is detected, it indicates that a resistive open defect has occurred. Furthermore, the testing circuit 10 that has detected the resistive open defect, and therefore the part under test where the resistive open defect has been detected, may be identified on the basis of the timing of output of a 1 (that is, what number in order a 1 has been output).

If the value of each flip-flop 13 is initialized to "1" at the end of the initialization procedure, the value of the data input signal I in the test pattern input procedure may be set to "0" and the value of the data input signal I in the detection result output procedure may be set to "1". That is, the value of the data input signal I in the test pattern input procedure may be set to a value different from the initial value in the flip-flops 13. The value of the data input signal I in the detection result output procedure may be set to the same value as the initial value in the flip-flops 13.

As has been described above, according to the present embodiments, delay faults in a semiconductor integrated circuit may be properly detected. Test patterns are not limited to predetermined ones. Therefore, test patterns generated by an ATPG may be used to conduct testing relating to delay faults while performing logic testing (for detecting primarily stuck-at faults) conventionally widely used.

Any part of the semiconductor integrated circuit 1 may be tested.

Having described embodiments of the present invention, the present invention is not limited to the specific embodiment and various changes and modifications may be made without departing from the spirit of the present invention as defined in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor circuit for testing a logic circuit, the semiconductor circuit comprising:
an exclusive OR circuit configured to receive an input testing signal to an inspection part under testing and a output testing signal from the inspection part under testing;
a multiplexer configured to receive a result signal output from the exclusive OR circuit and a clock signal; and
a flip-flop configured to store a logical value represented by a captured signal in synchronization with a multiplexed signal output from the multiplexer, the captured signal being selected from an entered signal and a data signal that is output from another semiconductor circuit for testing.

2. The semiconductor circuit according to claim 1,
wherein when the entered signal is set to a first logical value to test the inspection part, the entered signal is selected as the captured signal and the multiplexer outputs the result signal that is selected as the multiplexed signal by the multiplexer,
wherein when the entered signal is set to a second logical value to disable the inspection part from testing, the multiplexer outputs the clock signal that is selected as the multiplexed signal by the multiplexer.

3. The testing method according to claim 1, further comprising:
setting the entered signal to a first logical value to test the inspection part;
setting the entered signal to a second logical value to disable the inspection part from testing.

4. A semiconductor circuit for testing a logic circuit, the semiconductor circuit comprising:
a first testing circuit includes:
a first exclusive OR circuit configured to receive a first input testing signal to a first inspection part under testing and a first output testing signal from the first inspection part under testing,
a first multiplexer configured to receive a first result signal output from the first exclusive OR circuit and a clock signal, and
a first flip-flop configured to store a logical value represented by a first captured signal in synchronization with a first multiplexed signal output from the first multiplexer, a first entered signal being input to the first flip-flop as the first captured signal; and
a second testing circuit includes:
a second exclusive OR circuit configured to receive a second input testing signal to a second circuit under testing and a second output testing signal from the second circuit under testing,
a second multiplexer configured to receive a second result signal output from the second exclusive OR circuit and a clock signal, and
a second flip-flop configured to store a logical value represented by a second captured signal in synchronization with a second multiplexed signal output from the second multiplexer, the second captured signal being selected from the first entered signal and a first data signal that is output from the first flip-flop.

5. The semiconductor circuit for testing a logic circuit according to claim 4,
wherein the first entered signal is selected as the second captured signal, when the first inspection part and a second inspection part are under testing,
wherein the first data signal is selected as the second captured signal, when the first inspection part and the second inspection part are not under testing.

6. A testing method for logic circuit by using a semiconductor circuit includes an exclusive OR circuit, a multiplexer, and a flip-flop, the testing method comprising:
receiving an input testing signal to an inspection part under testing and a output testing signal from the inspection part under testing by the exclusive OR circuit;
receiving a result signal output from the exclusive OR circuit and a clock signal by the multiplexer; and
storing a logical value by the flip-flop, the logical value being represented by a captured signal in synchronization with a multiplexed signal output from the multiplexer, the captured signal being selected from an entered signal and a data signal that is output from another semiconductor circuit for testing.

7. A testing method for logic circuit by using a semiconductor circuit includes a first exclusive OR circuit, a first multiplexer, a first flip-flop, a second exclusive OR circuit, a second multiplexer, and a second flip-flop, the testing method comprising:
receiving a first input testing signal to a first inspection part under testing and a first output testing signal from the first inspection part under testing by a first exclusive OR circuit;
receiving a first result signal output from the first exclusive OR circuit and a clock signal by a first multiplexer;
storing a logical value by a first flip-flop, the logical value being represented by a first captured signal in synchronization with a first multiplexed signal output from the first multiplexer, a first entered signal being input to the first flip-flop as the first captured signal;
receiving a second input testing signal to a second circuit under testing and a second output testing signal from the second circuit under testing by a second exclusive OR circuit;
receiving a second result signal output from the second exclusive OR circuit and a clock signal by a second multiplexer; and
storing a logical value by a second flip-flop, the logical value being represented by a second captured signal in synchronization with a second multiplexed signal output from the second multiplexer, the second captured signal being selected from the first entered signal and a first data signal that is output from the first flip-flop.

8. The testing method according to claim 7, further comprising:
selecting the first entered signal as the second captured signal, when the first circuit and the second circuit is under testing; and
selecting the first data signal as the second captured signal, when the first inspection part and the second inspection part are not under testing.

* * * * *